United States Patent [19]
Rusu et al.

[11] Patent Number: 5,598,348
[45] Date of Patent: Jan. 28, 1997

[54] METHOD AND APPARATUS FOR ANALYZING THE POWER NETWORK OF A VLSI CIRCUIT

[75] Inventors: Stefan Rusu, Sunnyvale; Clayton L. Yee, San Francisco, both of Calif.

[73] Assignee: Sun Microsystems, Inc., Mountain View, Calif.

[21] Appl. No.: 310,936

[22] Filed: Sep. 22, 1994

[51] Int. Cl.$^6$ ................................................ G06F 17/50
[52] U.S. Cl. ........................................ 364/491; 364/490
[58] Field of Search .................................. 364/488, 489, 364/490, 491

[56] References Cited

U.S. PATENT DOCUMENTS

| | | | |
|---|---|---|---|
| 4,698,760 | 10/1987 | Lembach et al. | 364/490 |
| 5,119,314 | 6/1992 | Hotta et al. | 364/491 |
| 5,349,542 | 9/1994 | Brasen et al. | 364/578 |
| 5,392,221 | 2/1995 | Donath et al. | 364/489 |
| 5,404,310 | 4/1995 | Mitsuhashi | 364/490 |

OTHER PUBLICATIONS

"Computation of Power Supply Nets in VLSI Layout" by H. J. Rothermel et al, IEEE 18the Design Automation Conference, 1981, pp. 37–42.

"Automated Extraction of SPICE Circuit Methods from Symbolic Gate Matrix Layout with Prunting" by R. D. Freeman et al, IEEE 23rd Design Automation Conf., 1986, pp. 418–424.

"Resistance Extraction in a Hierarchical IC Artwork Verification System" by S. Mori et al., IEEE 1985, pp. 196–198.

"Optimization of Digital MOS VLSI Circuits" by M. D. Matson, Chapel Hill Conference, 1985, pp. 109–115.

"Automatic Sizing of Power/Ground (P/G) Networks in VLSI" by R. Dutta et al, 26th ACM/IEEE Design Automation Conference, 1989, pp. 783–786.

*Primary Examiner*—Vincent N. Trans
*Attorney, Agent, or Firm*—Flehr, Hohbach, Test, Albritton & Herbert

[57] ABSTRACT

A method and apparatus to model the power network of a VLSI circuit is described. The method includes the step of extracting the power network associated with a semiconductor circuit layout. A compacted power network is then derived from the power network. The compacted power network includes a compacted primary resistive network to characterize the electrical resistance of the power trunks within the semiconductor circuit layout. The compacted power network also includes a compacted secondary resistive network to characterize the electrical resistance of power straps that deliver power to transistors within the semiconductor circuit layout. The compacted power network constitutes a network of compaction component values that correspond to functional regions in the semiconductor circuit layout. Each of the compaction component values includes an associated set of spacial compaction values that characterize the total resistance of a functional region. The operation of the compacted power network is simulated on a circuit simulation program to identify areas in the compacted power network that do not comply with predetermined power network performance criteria, such as electromigration limits and voltage drop limits. The semiconductor circuit layout is then reconfigured to satisfy the predetermined power network performance criteria.

8 Claims, 9 Drawing Sheets

METHOD AND APPARATUS FOR ANALYZING THE POWER NETWORK OF A VLSI CIRCUIT

BRIEF DESCRIPTION OF THE INVENTION

This invention relates generally to the design of Very Large Scale Integration (VLSI) circuits using electronic design automation techniques. More particularly, this invention describes a method and apparatus to model the power network of a VLSI circuit as a resistive network and to subsequently execute a set of simulations on the resistive network to identify inferior power network performance.

BACKGROUND OF THE INVENTION

Very Large Scale Integration (VLSI) circuits are designed with the use of Electronic Design Automation (EDA) tools, also called Computer Aided Design (CAD) tools. Typically, the design process begins with a circuit being specified in a Hardware Description Language (HDL), such as Verilog or VHDL. The HDL description is a set of statements in a computer language format that define the functional operation to be performed by the circuit.

An HDL circuit simulator is used to run a circuit simulation of the HDL description. Modifications to the HDL description are made based upon the results of the HDL circuit simulation.

In addition to its function as a simulator of an HDL description, the HDL circuit simulator is used to generate a netlist. A netlist defines the components and interconnections between the components required to implement the functional operation specified in the HDL circuit description.

Once a netlist has been generated, there are a number of commercially available "silicon compilers", also called "place and route tools", that are used to convert the netlist into a semiconductor circuit layout. The semiconductor circuit layout specifies the physical implementation of the circuit in silicon, or some other semiconductive material. The semiconductor layout includes metal conductive paths to deliver power to different cells in the circuit. In addition, the semiconductor layout includes a set of power trunks that are used to delivery power to the metal conductive paths.

The metal conductive paths and power trunks of a circuit constitute a power network. While there are a number of known EDA tools to test the logical operation of a VLSI circuit, EDA tools to test the operation of a power network of a VLSI circuit are not prevalent. Using existing EDA tools to test the operation of a power network is computationally expensive. The computational expense associated with prior art devices is attributable to the fact that there is a large amount of conductive metal in the power network that must be analyzed. Thus, it would be highly desirable to provide a method and apparatus that reduces the complexity of analyzing the power network of a VLSI circuit.

Two major concerns in analyzing the efficiency of a power network are voltage drop and electromigration. Excessive voltage drop in a circuit must be avoided so that the circuit elements at the physical center of a chip receive sufficient voltage. In other words, if the voltage drop caused by the path resistance to the center of the chip is too large, then the voltage received by the circuit elements at the center of the chip will not be sufficient. Consequently, it would be desirable to provide a method and apparatus to efficiently analyze the voltage drops of a power network in order to identify excessive voltage drops at the nodes of the power network.

The second salient concern in analyzing the efficiency of a power network is to assess whether electromigration will occur in the power network. If the current density driven through a piece of conductive metal is too high, then the atoms in the metal migrate along the conductive metal. This phenomenon, known as electromigration, eventually results in the deterioration of the conductive metal and the failure of the semiconductor circuit. Consequently, an assessment of a power network must include the identification of all regions of the power network that are susceptible to electromigration.

SUMMARY OF THE INVENTION

A method and apparatus to model the power network of a VLSI circuit is described. The method includes the step of extracting the power network associated with a semiconductor circuit layout. A compacted power network is then derived from the power network. The compacted power network includes a compacted primary resistive network to characterize the electrical resistance of the power trunks within the semiconductor circuit layout. The compacted power network also includes a compacted secondary resistive network to characterize the electrical resistance of power straps that deliver power to transistors within the semiconductor circuit layout. The compacted power network constitutes a network of compaction component values that correspond to functional regions in the semiconductor circuit layout. Each of the compaction component values includes an associated set of spacial compaction values that characterize the total resistance of a functional region. The operation of the compacted power network is simulated on a circuit simulation program to identify areas in the compacted power network that do not comply with predetermined power network performance criteria, such as electromigration limits and voltage drop limits. The semiconductor circuit layout is then reconfigured to satisfy the predetermined power network performance criteria.

The apparatus of the invention includes a general purpose computer that stores a semiconductor circuit layout. A power network extraction device operating on the computer extracts the power network corresponding to the semiconductor circuit layout. The compacted power network is derived from a primary resistive network derivation mechanism and a secondary resistive network definition mechanism running on the computer. A circuit simulation program running on the computer processes the compacted power network to identify areas in the semiconductor circuit layout that do not comply with predetermined power network performance criteria. A place and route refinement rulebase running on the computer generates instructions to modify the semiconductor circuit layout.

The invention provides a comprehensive methodology to simplify the analysis of a power network. The compaction component values used to characterize the compacted power network directly correspond to different functional regions of the semiconductor circuit layout. The compaction of a functional region of the semiconductor circuit layout into a compaction component value simplifies the analysis of the power network. Moreover, the compaction component values allow the power network to be simulated on commercially available circuit simulation programs, such as SPICE. Consequently, a thorough analysis of the power network is possible. The invention permits a comprehensive analysis of important power network performance parameters such as problematic voltage drops and electromigration violations. The invention also facilitates the analysis of a power network that includes the power parameters associated with the physical package housing the semiconductor.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
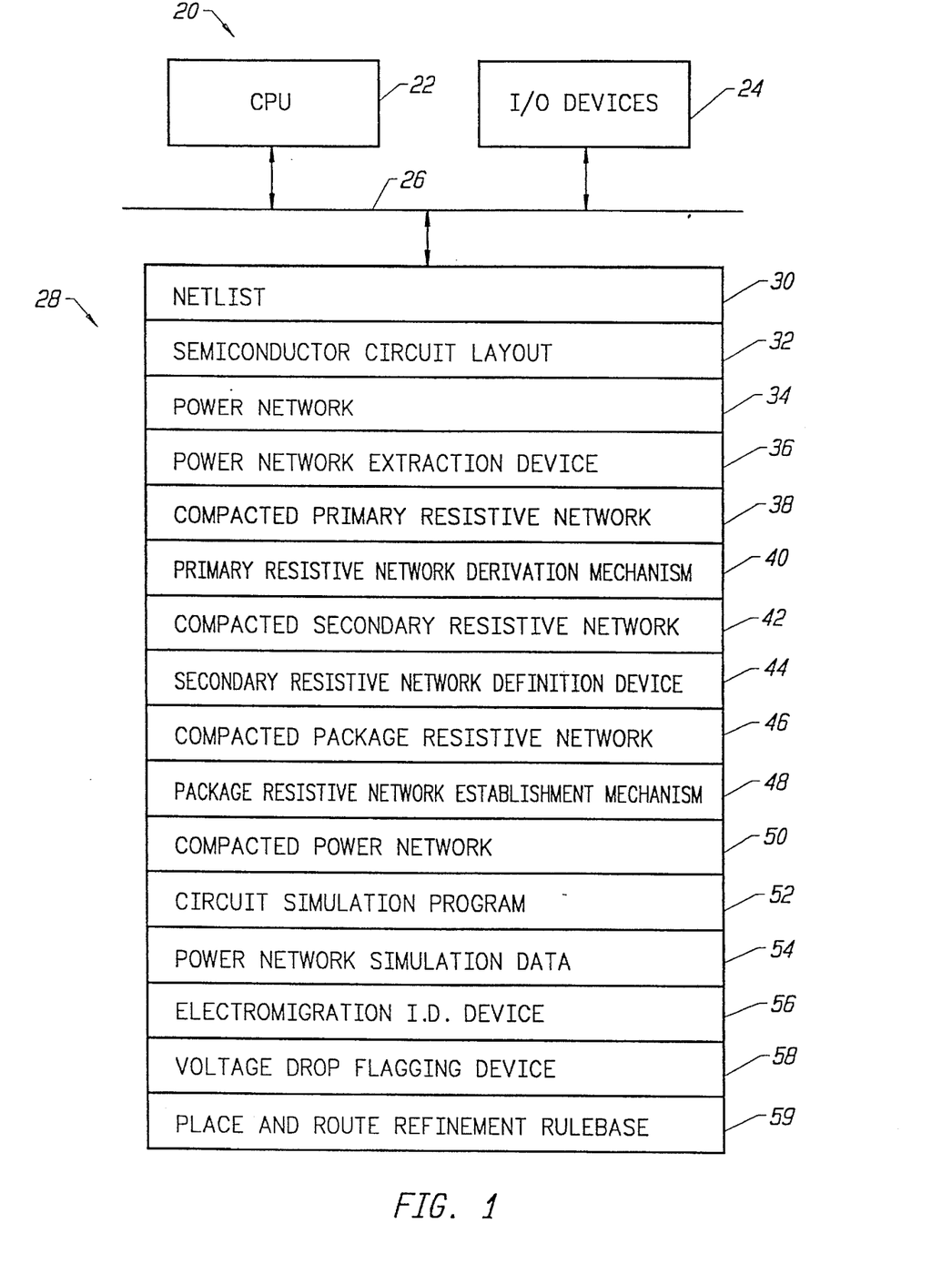
FIG. 1 illustrates an apparatus constructed in accordance with one embodiment of the present invention.

FIG. 1 depicts an embodiment of a power network modeling apparatus 20 in accordance with the present invention. The apparatus 20 includes a central processing unit (CPU) 22 that communicates with input/output devices 24 over a bus 26. The input/output devices 24 include such items as a keyboard, a mouse, a computer monitor, a communication port, a printer, etc. The apparatus 20 also includes a memory device 26 that stores data files and sets of executable instructions in the form of computer programs. The operation of a CPU 22, I/O devices 24, a bus 26, and a memory device 28 are well-known. Therefore, attention focuses upon the data files and computer programs executed by the apparatus 20 of the invention. The following general description of the data files and computer programs associated with the apparatus of the invention serves to provide an overview of the operation of the invention.

Memory 28 stores a netlist 30 corresponding to a VLSI circuit. As indicated above, a netlist is a description of circuit components and the connections between the circuit components. The netlist is generated by an HDL simulator (not shown).

The memory 28 also stores a semiconductor circuit layout 32 corresponding to the netlist 30. The semiconductor circuit layout 32 is generated by a place and route tool (not shown) that processes the netlist 30. The semiconductor circuit layout is a plot of semiconductor elements that are used to implement the circuit specified by the netlist. A given location in the plot will be specified as an n-well, a p-well, an n-diffusion, a p-diffusion, polysilicon, metal, etc. The place and route tool also generates and prints, through an input/output printer device, a hardcopy of the semiconductor circuit layout.

A power network 34 is extracted from the semiconductor circuit layout 32 by a power network extraction device 36. The power network 34 includes the metal components of the semiconductor circuit layout 32 and any circuit segments connected to it, such as diffusion regions, polysilicon regions, etc.

A compacted primary resistive network 38 is also stored in memory 28. The compacted primary resistive network 38 is a simplified characterization of the resistance of the primary power trunks of the power network 34. As will be described below, the compacted primary resistive network 38 is modeled in such a manner to facilitate subsequent simulation of the network. The compacted primary resistive network 38 may be derived from the power network 34 using a primary network derivation mechanism 40. Alternately, the compacted primary resistive network 38 may be identified by engineers from inspection of a hardcopy of the semiconductor circuit layout. By this approach, the information representing the compacted primary resistive network 38 is then entered into the apparatus 20 through an input/output device 24.

A compacted secondary resistive network 42 is also stored in memory 28. The compacted secondary resistive network 42 is a simplified characterization of the resistance of the power straps used to feed the circuit components of the semiconductor circuit layout 32. The compacted secondary resistive network 42 may be derived from the power network 34 by a secondary resistive network definition device 44. As in the case of the primary resistive network, this information may also be obtained from a hardcopy of the semiconductor circuit layout.

In one embodiment of the invention, the apparatus 20 includes resistance information on the physical package that houses the semiconductor. This information is referred to herein as the compacted package resistive network 46. The package resistive network 46 information may be obtained from a package resistive network establishment mechanism 48. A specification of the package resistive network properties may also be specified through interactions with input/output devices 24.

The compacted primary resistive network 38, the compacted secondary resistive network 42, and the compacted package resistive network 46 constitute, in sum, a compacted power network 50. The network 50 is applied to a circuit simulation program 52. An industry standard circuit simulation program 52 that may be used in accordance with the invention is the commercially available Simulation Program with Integrated Circuit Emphasis (SPICE). The circuit simulation of the collapsed network 50 generates power network simulation data 54.

An electromigration identification device 56 processes the power network simulation data to identify problematic electromigration regions in the semiconductor circuit layout. In addition, the power network simulation data is processed by an excessive voltage drop flagging device 58 to identify problematic voltage drops in the semiconductor circuit layout.

The output from the electromigration identification device 56 and the excessive voltage drop flagging device 58 is used to modify the semiconductor circuit layout 32, if necessary. The semiconductor circuit layout 32 may be modified through commands specified through the input/output devices to the place and route tool. Alternately, a place and route refinement rulebase 59 may be used to automatically generate the required commands for the place and route tool so that the revised semiconductor circuit layout is within preferable voltage drop and electromigration limits.

The apparatus of FIG. 1 provides an automated and efficient technique for analyzing the power network of a semiconductor circuit layout. More particularly, the apparatus of FIG. 1 allows a specific analysis of electromigration problems and voltage drop problems for a specified semiconductor circuit layout. A more particular discussion of the operation of the invention is provided below. Specifically, the processing steps associated with the invention are set forth in FIG. 2 and specific examples describing the processing steps are set forth in the remaining figures.

Figure 2:
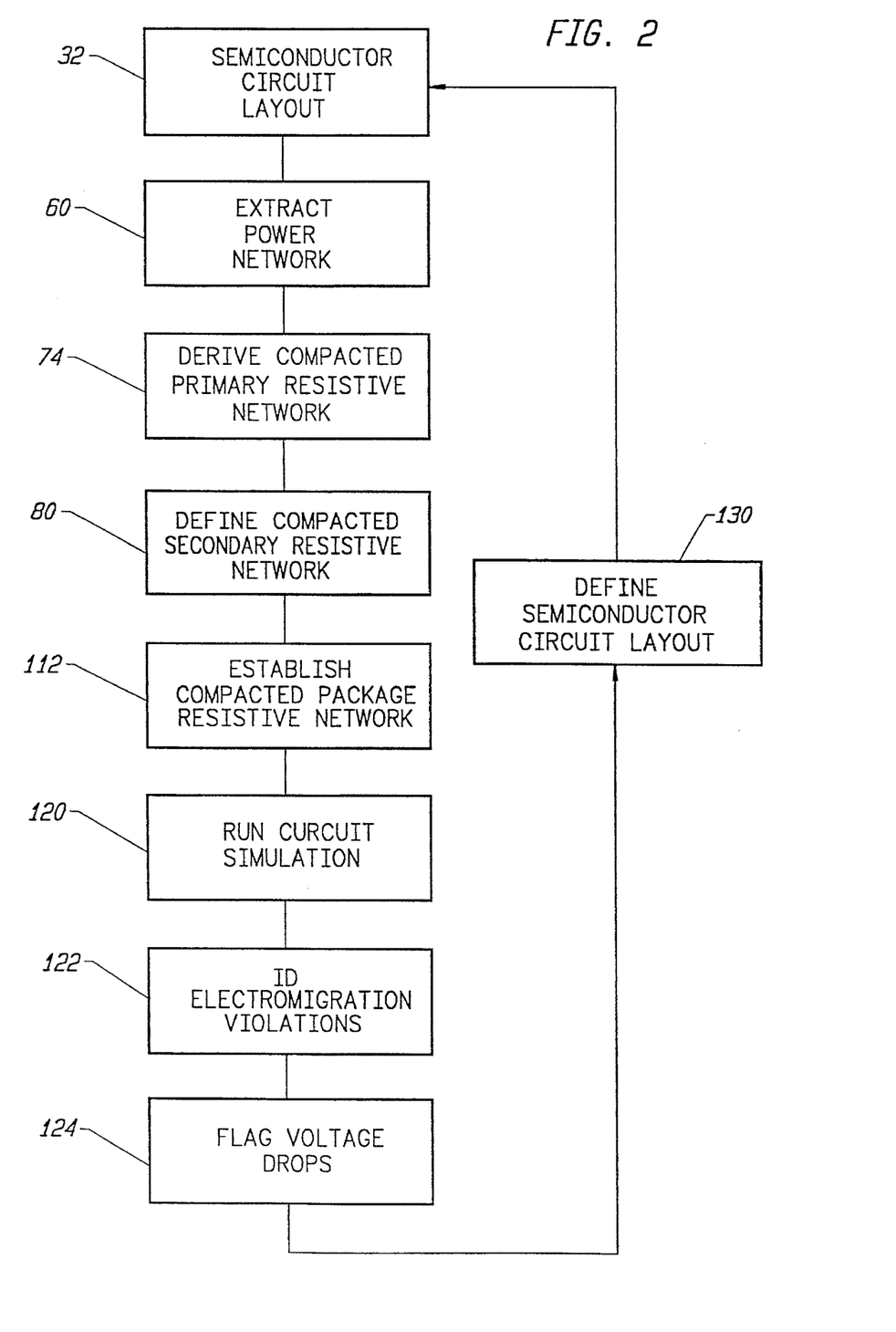
FIG. 2 illustrates method steps executed by the apparatus of FIG. 1.

FIG. 2 illustrates that the processing of the invention begins with a semiconductor circuit layout 32. The first processing operation is to extract the power network 34 from the semiconductor circuit layout (block 60). This operation may be performed by the power network extraction device 36 of FIG. 1. This element is known in the art. Commercially available place and route tools include a utility to extract from a semiconductor circuit layout all portions of the semiconductor circuit layout that are composed of metal and are connected to metal. The product DRACULA™ from Cadence, San Jose, Calif., is an example of a power network extraction device 36 that may be used in accordance with the invention.

Figure 3:
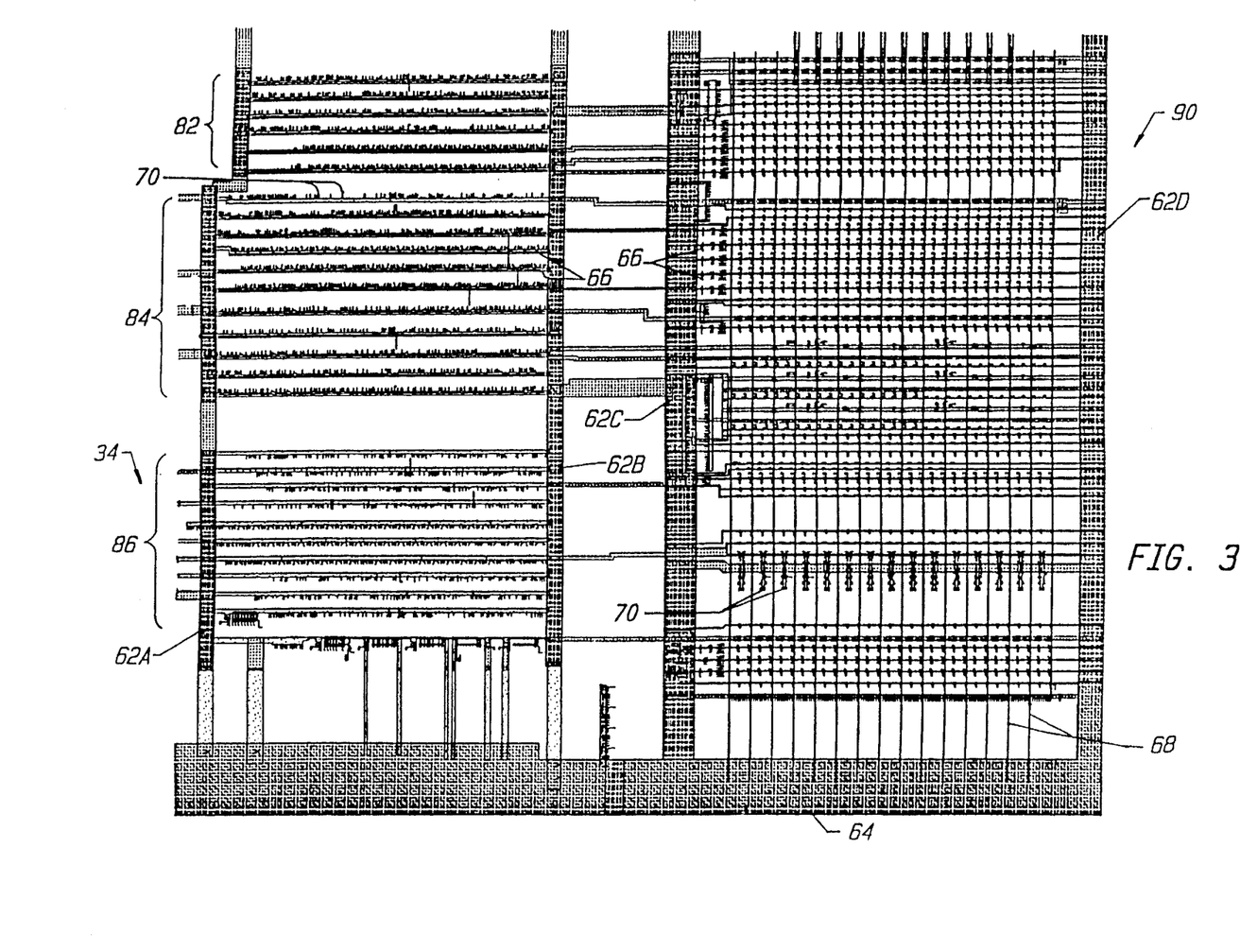
FIG. 3 illustrates a portion of a semiconductor circuit power network.

FIG. 3 illustrates a hardcopy of a portion of a power network 34. The power network 34 includes all metal components of the semiconductor circuit layout 32 and any circuit elements (diffusions, polysilicon, etc.) electrically connected to those metal components.

The power network 34 of FIG. 3 includes a set of vertical power trunks 62 (62A, 62B, 62C, and 62D) and a horizontal power trunk 64. Connected between the vertical power trunks 62 are horizontal power straps 66. Certain regions of the power network 34 include vertical power straps 68. The vertical power straps 68 are connected between horizontal power trunks (only one power trunk 64 is shown in FIG. 3).

FIG. 3 illustrates that each horizontal strap includes a set of transistor connection leads 70. As indicated above, the power network 34 does not depict the actual transistors in the semiconductor circuit layout.

Figure 4:
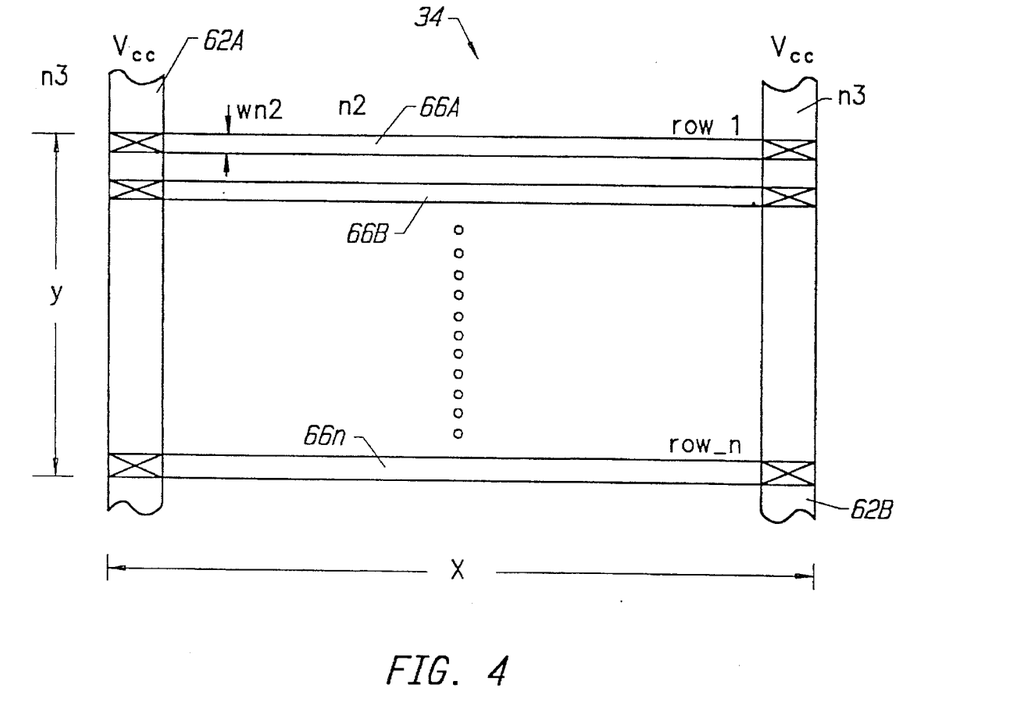
FIG. 4 is a simplified illustration of a segment of the semiconductor circuit layout of FIG. 3.

FIG. 4 is a simplified depiction of a portion of the power network 34 of FIG. 3. FIG. 4 shows vertical power trunks 62A and 62B. The figure also shows a set of horizontal power straps 66A–66N. FIG. 4 illustrates that the power network 34 has a corresponding X-coordinate axis and Y-coordinate axis. The X-Y coordinate grid allows each element of the power network 34 to be spacially defined.

Returning now to FIG. 2, the next processing step associated with the invention is to derive the compacted primary resistive network (Block 74). The compacted primary resistive network is derived by performing a set of spacial compaction operations to generate a set of spacial compaction values. The spacial compaction values may then be used to derive corresponding resistance values.

Figure 5:
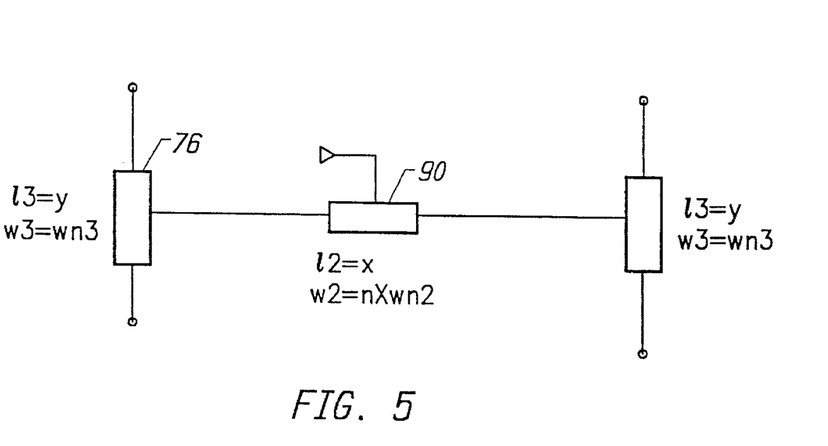
FIG. 5 illustrates a spacial collapse operation to simplify the semiconductor circuit layout of FIG. 4.

FIG. 5 illustrates this operation in relation to FIG. 4. FIG. 5 shows a primary compaction component 76 that corresponds to the vertical power trunk 62A. This primary compaction component 76 has two spacial compaction values characterizing the vertical power trunk 62A. The spacial compaction values are obtained by performing a spacial compaction operation. In the case of the primary resistive network, this operation entails specifying the spacial compaction value as consisting of the length and width of the power trunk. Thus, as shown in FIG. 5, primary compaction component 76 has a corresponding width W3 defined along the X-axis. This width is also equivalent to the width of metal-3 that forms the vertical power trunk 62A. The primary compaction component 76 also has a corresponding length L3 defined along the Y-axis. In this embodiment of the invention, the length and width values constitute the spacial compaction values.

The spacial compaction values are useful because they provide a direct translation to a resistance value for the power trunk. That is, the ratio of the spacial compaction values of unit length divided by unit width is defined as a "square". The sheet resistivity of the metal forming the trunk, a known quantity, multiplied by the ratio of the spacial collapse values (length/width) defines the total resistivity of the power trunk. This value is referred to herein as the compacted resistance value because it is derived from spacial compaction values.

A network of primary compaction components constitutes a primary resistive network 38. As indicated in the previous paragraph, the primary compaction components have corresponding resistance values.

The step of deriving the primary resistive network (block 74) may be performed by manually measuring the lengths and widths of the power trunks of the power network 34, shown in FIG. 3. That is, the power trunks are measured to determine the spacial compaction values. This operation may also be performed by a primary resistive network derivation mechanism 40. As previously indicated, the power network 34 has an associated grid, shown in FIG. 4. That is, the power network 34 is characterized as different metal segments at different spacial regions of the grid. Consequently, a set of code, denominated herein the primary resistive network derivation mechanism 40, may be used to derive from the grid components the various lengths and widths of the power trunks described in the power network 34.

Returning now to FIG. 2, the next step in the disclosed method is to define a compacted secondary resistive network (block 80). As indicated above, the compacted secondary resistive network is a simplified characterization of the resistance of the power straps used to feed the circuit components of the semiconductor circuit layout 32. This concept is most fully appreciated with reference to FIG. 3.

In defining the compacted secondary resistive network, it is useful to isolate functional regions of the power network 34. These functional regions correspond to the functional regions of the semiconductor circuit layout 32. Functional regions 82–86 in FIG. 3 are standard cell regions of the semiconductor circuit layout 32.

Figure 6:
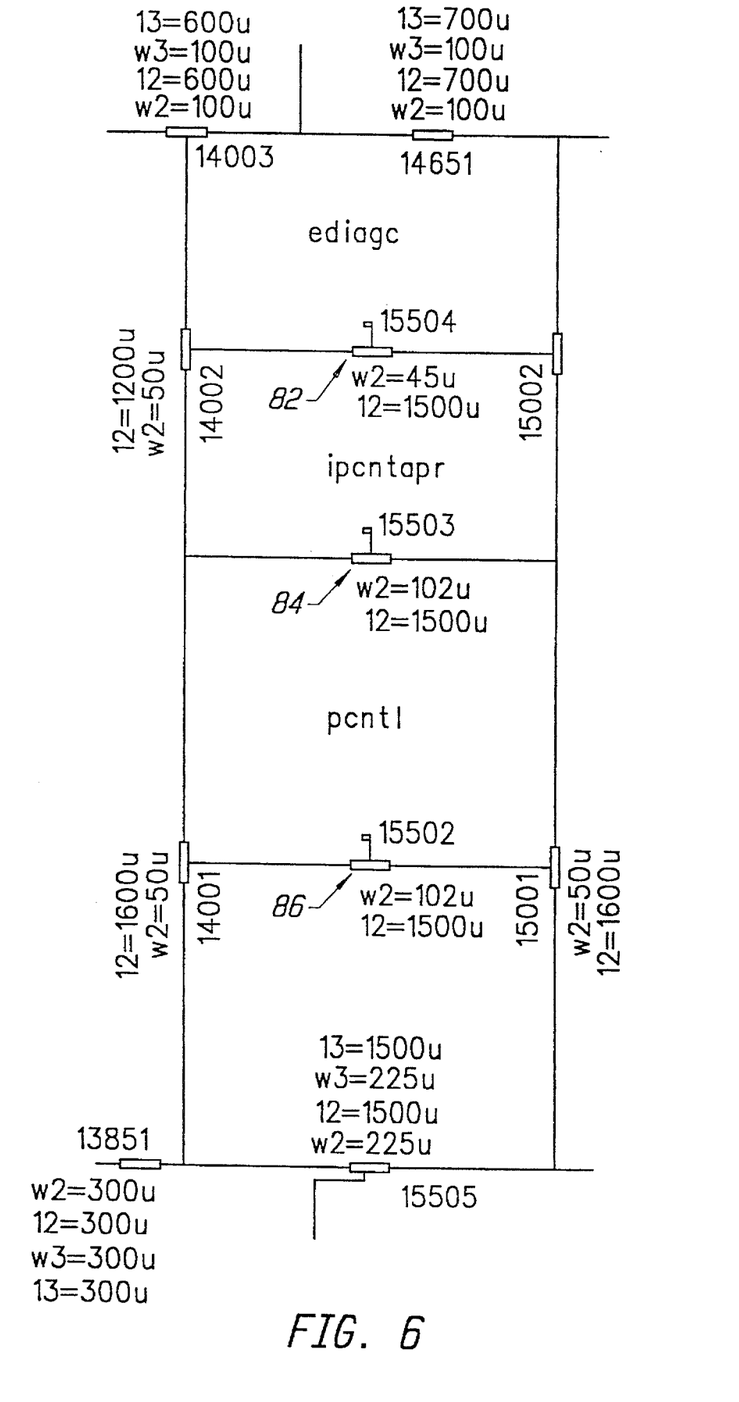
FIG. 6 illustrates a set of spacial collapse values associated with standard cell regions of a semiconductor circuit layout.

FIG. 6 illustrates a compacted primary and secondary resistive network associated with the functional regions 82–86 shown in FIG. 3. The spacial compaction operations necessary to transform the power network of FIG. 3 to the compacted resistive network of FIG. 6 is most fully appreciated with reference to FIGS. 4 and 5. FIG. 5 illustrates a secondary compaction component 90. The secondary compaction component 90 has two corresponding spacial compaction values. The first value is the length L2 of the horizontal straps 66A–66N shown in FIG. 4. As shown in FIG. 4, this length is an X-axis coordinate value. The second compaction value is the width W2 of all the horizontal straps 66A–66N of a specified functional region. As shown in FIG. 5, this quantity can be characterized as the width of each horizontal strap 66 (width metal-2—WM2) times the number of rows N. More typically, it each horizontal strap 66 will have a different width. In such a case, the sum of the widths must be calculated. In either case, the spacial compaction operation entails the identification of a set of horizontal power straps and the compaction of the horizontal power straps into a single spacial compaction value.

Returning now to FIG. 6, spacial compaction values are illustrated for the functional regions 82–86 of the power network of FIG. 3. Functional region 82 of FIG. 3 is shown in FIG. 6 as a secondary compaction component marked 15504. This component has two associated spacial compaction values: w2=45 microns and 12=1500 microns. The w2 value corresponds to the total width of the 6 horizontal power straps shown in functional region 82 of FIG. 3. The 12 value corresponds to the length of each horizontal power strap shown in functional region 82 of FIG. 3. The functional region is identified in FIG. 6 as "ediagc" to indicate that it is a diagnostic control region of the semiconductor circuit layout.

Functional region 84 of FIG. 3 is shown in FIG. 6 as secondary compaction component 15503. This component has spacial compaction values of w2=102 microns and 12=1500 microns. The functional region is identified as "ipcntapr" to indicate that it is an instruction pointer control region of the semiconductor circuit layout.

Functional region 86 of FIG. 3 is shown in FIG. 6 as secondary compaction component 15502. This component has spacial compaction values of w2=1102 microns and 12=1500 microns. Note that functional regions 84 and 86 each have 11 horizontal power straps 66. Consequently, both regions have the same 12 value.

Note that FIG. 6 also includes primary compaction component values corresponding to the primary resistive network. For example, to the left of secondary compaction component 15504 is primary compaction component 14002. This component has spacial compaction values of 12=1200 microns and w2=50 microns. The w2 value is equivalent to the width of the vertical power bus 62A. The 12 value is equivalent to a segment of the vertical length of the vertical power bus 62A. To the left of secondary compaction component 15502 is primary compaction component 14001. This component has spacial compaction values of 12=1600 microns and w2=50 microns. Note that the w2 value is the same as the w2 value associated with primary compaction component 14002. The equivalent value is attributed to the fact that the same power bus 62A is characterized.

Note at the bottom of FIG. 6 primary compaction component 15505. This component corresponds to the large horizontal trunk 64 shown in FIG. 3. Further note that there are four spacial compaction values associated with the primary compaction component value 15505. In accordance with the spacial compaction operation performed in relation to the primary resistive network, four spacial compaction values are assigned to a primary compaction component value when the primary compaction component value incorporates two metal layers. Two metal layers are used in a power network 34 when the required power to be transported by a power trunk is beyond the capacity of a single layer power trunk. To prevent an excessively wide power trunk, the standard practice is to divide the power trunk between two metal layers. Advantageously, the power network modeling operation of the invention can handle this feature.

In FIG. 6, the primary compaction component 15505 includes two equivalent width values of 225 microns. One 225 micron bus component is at metal 2 (indicated by w2), while the other 225 micron bus component is at metal 3 (indicated by w3). When the network is simulated, as described below, both the metal 2 term (w2=225 microns) and the metal 3 term (w3=225 microns) are used in conjunction with the assessment of the remaining metal 2 values shown in FIG. 6.

As in the case of the primary resistive network 38, the spacial compaction values of the secondary compaction components may be derived from a hardcopy of the power network 34, as shown in FIG. 3. In the alternative, a secondary resistive network definition device 44 may be used. The secondary resistive network definition device 44 may be implemented as a set of computer instructions. The computer instructions are used to identify the grid components and associated lengths and widths of the power trunks described in the power network 34 stored in memory 28. The computer instructions also include a set of compaction instructions. The compaction instructions include instructions to identify a functional region, such as 82, 84, or 86 in FIG. 3. Information on functional regions may be derived from the general topology of the power network 34 or from the design specifications associated with the power network 34. After a functional region is identified, computer code is used to sum the widths of the power straps in the region to render a composite spacial compaction value.

Similar operations are performed by the primary resistive network derivation mechanism 40 when identifying a large power trunk with two metal layers. In this case, the computer instructions check to determine if the power trunk is divided into two layers. If so, spacial compaction values are determined for each layer. A two layer power trunk is identified by the computer instructions based upon design specifications associated with the power network 34. If the same operation is being performed manually, the two layer power trunk may be identified by its color in the hardcopy of the power network 34. That is, in a true hardcopy of the power network shown in FIG. 3, the place and route tool would generate a horizontal power trunk 64 with a different shade to indicate that it includes two metal layers.

Figure 7:
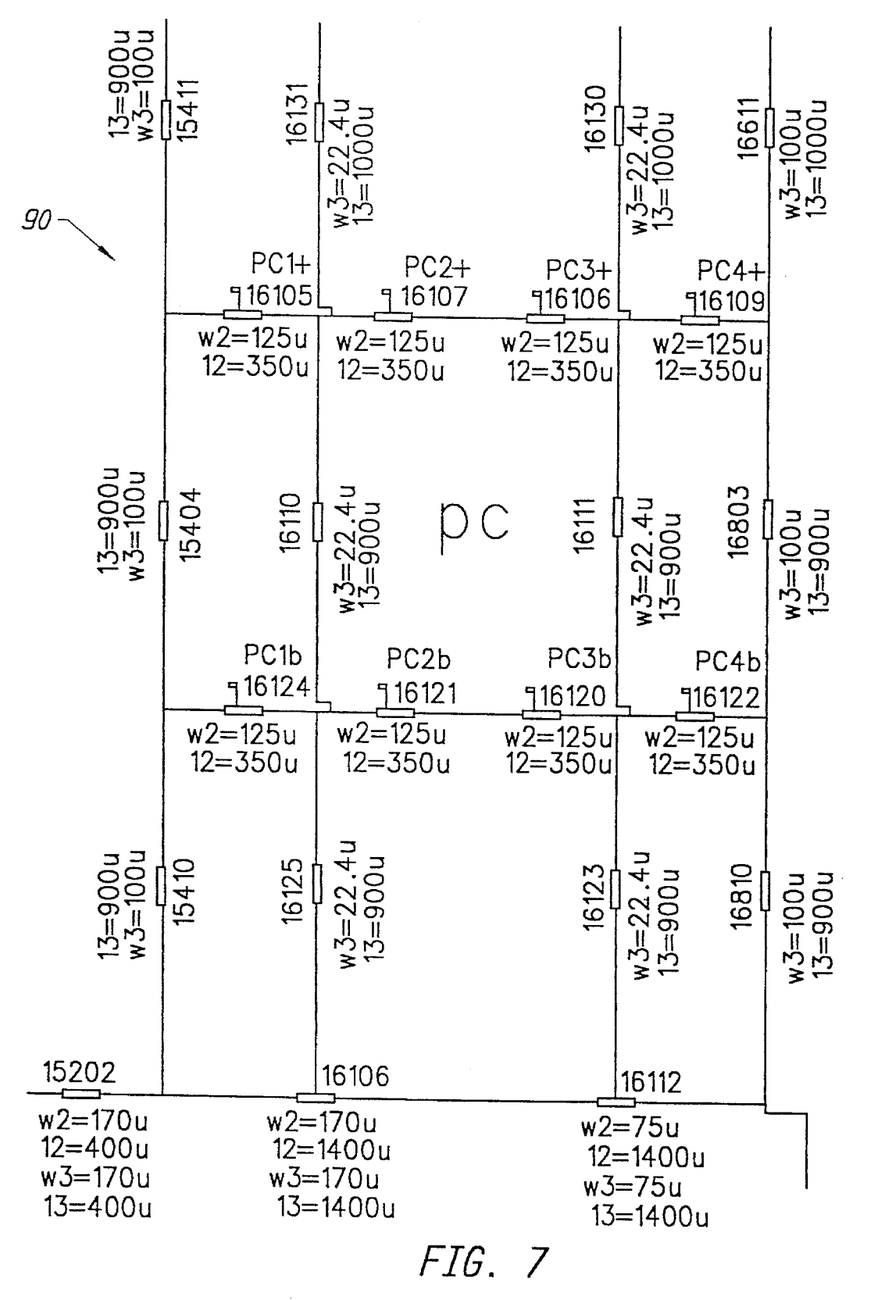
FIG. 7 illustrates a set of spacial collapse values associated with a datapath region of a semiconductor circuit layout.

FIG. 7 illustrates the primary compaction component values and the secondary compaction component values associated with the functional region 90 shown on the right half of FIG. 3. The functional region 90 is a Program Counter (PC) datapath with horizontal power straps 66 and vertical power straps 68. The primary compaction component values are derived in a manner as described above. The secondary compaction component values for the horizontal straps 66 are derived in a manner as described above. However, note that the datapath region 90 includes vertical power straps 68. The 15 vertical power straps shown in FIG. 3 are spatially compacted in a manner consistent with the compaction of the horizontal power straps. Note in FIG. 7 the secondary compaction component 16125. This component has spacial compaction values of w3=22.4 microns and 13=900 microns. The secondary compaction component 16123 has the same spacial compaction values. Thus, it can be appreciated that the 15 vertical power straps 68 of FIG. 3 are collapsed into two equivalent spacial compaction values, each having a width of w3=22.4 microns.

Notice in FIGS. 6 and 7 that the spacial compaction operation leads to a relatively uniform grid structure.

Figure 8:
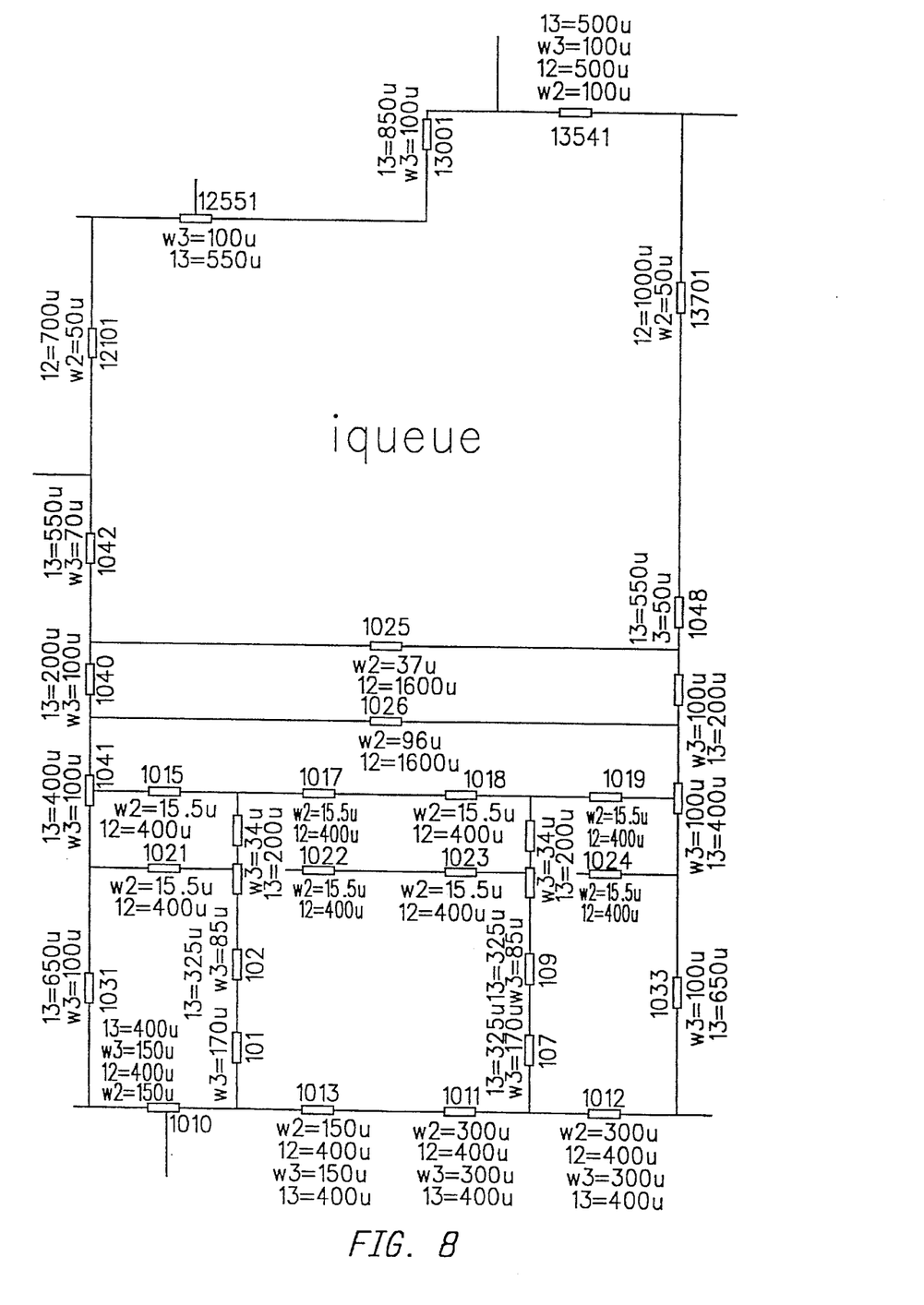
FIG. 8 illustrates a set of spacial collapse values associated with a custom cell region of a semiconductor circuit layout.

Another functional region of a circuit is shown in FIG. 8. The instruction queue (iqueue) shown in FIG. 8 does not have the spacial uniformity of standard cells (functional regions 82–86 in FIG. 3) or datapath cells (functional region 90 in FIG. 3). The instruction queue is a custom cell with an irregular circuit layout. Thus, in FIG. 8 the placement of spacial compaction values is not uniform. For example, note in FIG. 8 that the horizontally positioned secondary compaction components identified as IQ21, IQ22, IQ23, IQ24, IQ15, IQ17, IQ18, and IQ19 are positioned relatively close to one another. Similarly, the vertically positioned secondary compaction components identified as IQ1, IQ2, IQ7, and IQ9 are positioned relatively close to one another. This region corresponds to a dense power strap topology. The compaction of a dense power strap region may be performed using a predetermine rule set. For example, the rule set may specify that if the density of power straps in a given area is over a predetermined threshold, then the power straps in the given area are to be collapsed to yield a group of equivalent spacial compaction values. Note in FIG. 8 that the secondary compaction components identified as IQ15, IQ17, IQ18, IQ19, IQ21, IQ22, IQ23, and IQ24 each have the same spacial compaction values (w2=15.5 microns and 12=400 microns). Such a rule set may be embodied in the computer instructions of the secondary resistive network definition device 44.

Figure 9:
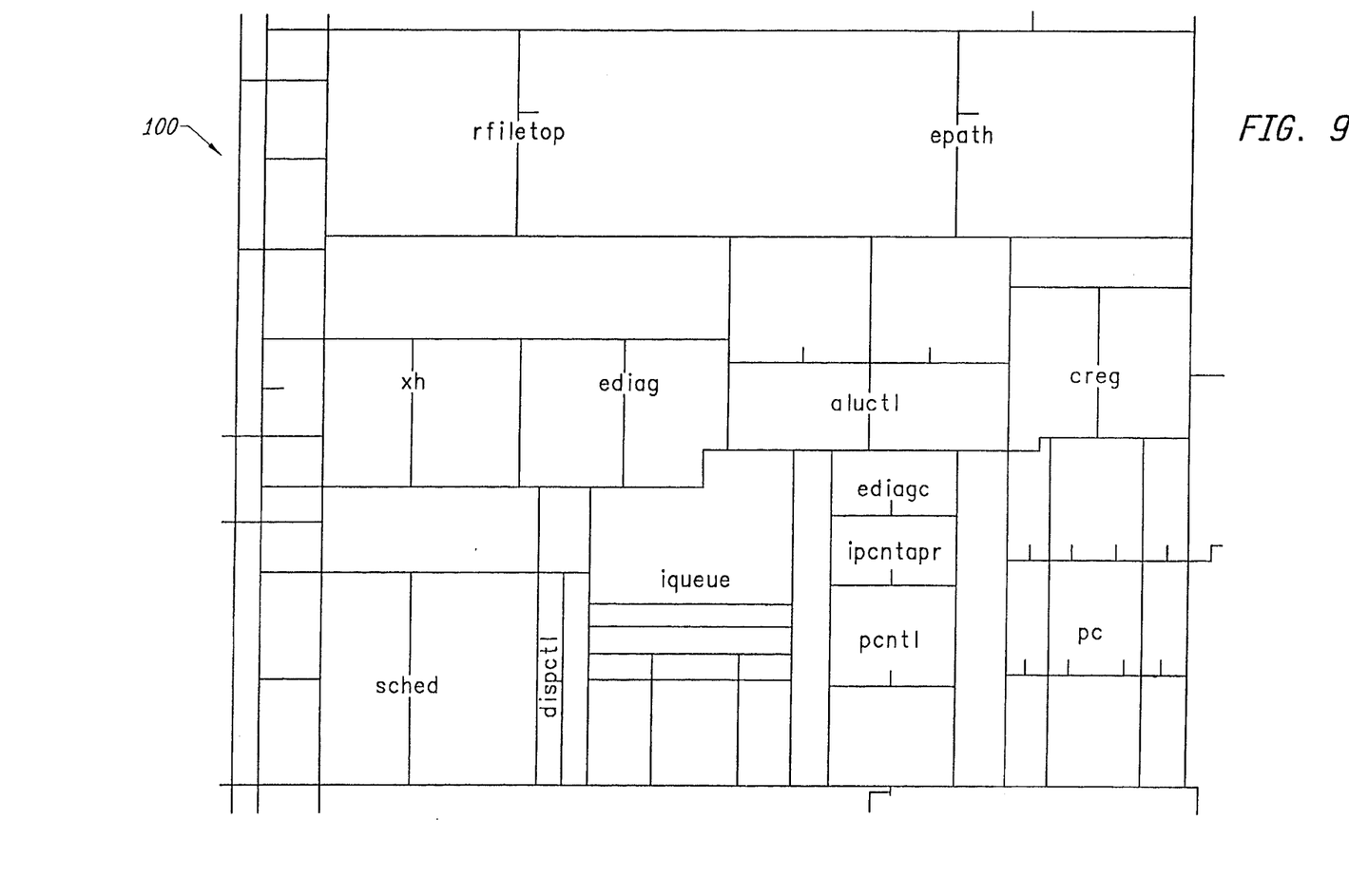
FIG. 9 illustrates the circuit segments of FIGS. 6–8 as forming a portion of a larger resistive network of a semiconductor circuit layout.

FIG. 9 illustrates the power network components of FIGS. 6–8 as forming a portion of a larger circuit 100. Each functional region of the larger circuit 100 has a corresponding name, such as "aluctl" for the Arithmetic Logic Unit Controller. Each functional region includes corresponding primary compaction component and secondary compaction component values. Each primary compaction component and secondary compaction component value has a set of corresponding spacial compaction values of the type previously described.

Figure 10:
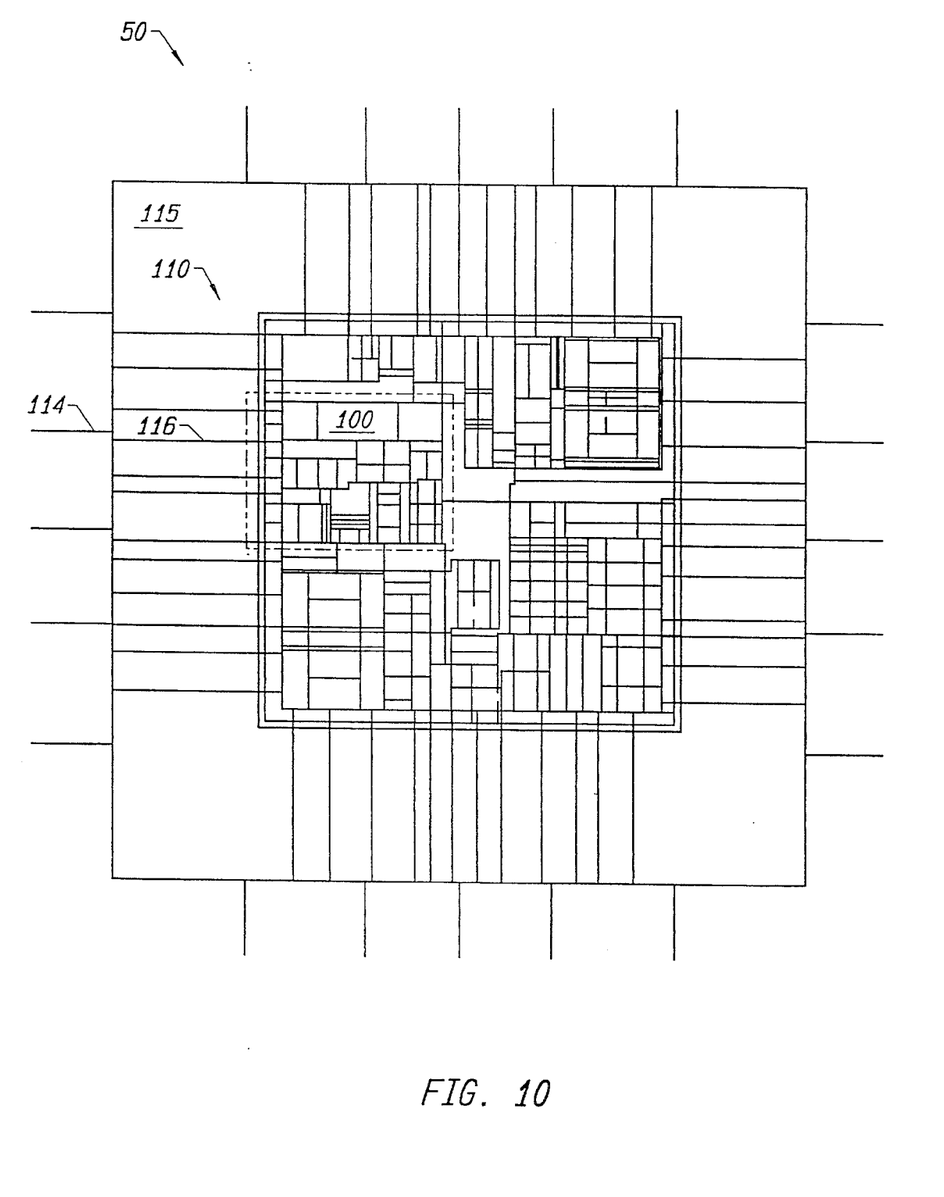
FIG. 10 illustrates the circuit segments of FIG. 9 forming a portion of a complete resistive network of a semiconductor circuit layout; the figure also illustrates package components as members of the resistive network.

FIG. 10 illustrates the power network components of FIG. 9 as forming a portion of a still larger circuit 110. The larger circuit 110 has all of the characteristics of the smaller circuit segments previously described. The power network components shown in FIG. 10 correspond to a complete power network of a complete semiconductor circuit layout. Thus, it can be appreciated from FIG. 10, that a complete resistive network can be developed in accordance with the invention to correspond with a given semiconductor circuit layout.

Returning now to FIG. 2, the next processing step shown in the figure is to establish a compacted package resistive network (block 112). Up to this juncture, the application has described the development of a complete resistive network to characterize the power network of a given semiconductor circuit layout. In one embodiment of the invention, the resistive network may be supplemented by a package resistive network that characterizes the electrical qualities of the package that houses the semiconductor circuit. The typical electrical path from outside a semiconductor package to a semiconductor circuit includes the following elements: a package pin, a power plane, a package trace, and a wire bond. That is, the electrical signal passes through a metallic package pin 114 that extends from the package (typically plastic or ceramic) housing 115. Based upon the geometry of the package pin, a resistance value can be assigned to it.

The power signal received by the package pin 114 is routed to a power plane that has a small resistive value. From the power plane, a via is used to route the power signal to a power trace. The power plane, via, and power trace each have an associated resistance dependent upon their topology. These resistance values may be added. The final resistive element in the power signal path is a bond wire. The resistance of the bond wire (including the resistance of the bond pad), which is contingent upon its geometry, may also be added to the resistance value of the power signal path. The sum of the resistances of the package pin, power plane, one or more vias, power trace, and bond wire may be summed to yield a compacted package resistance value which is generally identified in FIG. 10 as item 116. The sum of the compacted package resistance values constitutes a compacted package resistive network 46, stored as a data set in memory 28 of the apparatus of FIG. 1.

The compacted package resistive network 46 may be specified by a user operating the input/output devices 24, such as a keyboard. In the alternative, the data may be derived from a package resistive network establishment mechanism 48. This mechanism 48 is implemented as a set of computer code to interpret a physical description of a package. The physical description of the package is used to generate individual compacted package resistance values that form the compacted package resistive network 46.

It should be appreciated at this juncture that FIG. 10 illustrates a compacted power network 50 that includes a compacted primary resistive network 38, a compacted secondary resistive network 42, and a compacted package resistive network 46. The compacted primary resistive network 38 and the compacted secondary resistive network 42 respectively include primary compaction components and secondary compaction components. Each primary and secondary compaction component includes a corresponding set of spacial compaction values. These spacial compaction values can be used in conjunction with a sheet resistivity value to derive a resistance value associated with each compaction component. The resistance values of the compaction components can be linked with the resistance values associated with the compacted package resistive network 46. The compacted package resistance values associated with the compacted package resistive network directly define resistance values.

The present invention has described the construction of the power network shown in FIG. 10. This power network may now be simulated as a resistive circuit. As just described, the power network includes a set of values with a corresponding resistance. In addition, the values are physically linked to one another as shown in FIGS. 6–10. Consequently, the physical linking of the values allows the simulation of the compacted power network 50 as a resistive circuit.

Running a simulation of the compacted power network 50 is the next method step (block 120) shown in FIG. 2. The linked resistive values of the compacted power network 50 can be applied to a circuit simulation program 52, such as the commercially available Simulation Program with Integrated Circuit Emphasis (SPICE). In one embodiment of the invention, the circuit simulation program is used to assign resistance values to the compaction components, identify electromigration violations, and to flag excessive voltage drops in the power network. The identification of electromigration violations (block 122) and the flagging of excessive voltage drops (block 124) are two of the processing steps illustrated in FIG. 2.

These operations may be executed with a set of procedures or macros that operate in conjunction with the circuit simulation program. The following macros may be used to execute these operations. The macros are in the syntax used by SPICE.

(1) .macro m3 i1 i2 w3=1 l3=10000

(2) r3 i1 i2 'rho$_{l3}$m3 * l3/w3'

(3) .measure tran rms$_{l3}$3 rms par('i(r3)/(em$_{l3}$m3*w3)') from =0n to =12.5n (4) .measure tran max$_{l3}$v3 max par('v(i1)') from =0n to =12.5n (5) .eom m3

The first line of the first macro identifies the macro as "m3" which means it is applied to all metal 3 components in the power network. The "i1" and "i2" terms define the nodes at each end of an element to be analyzed. The term "w3=1" assigns a w3 width value of 1 micron if a width value is not passed to the macro. Similarly, the term "l3" assigns a l3 width value of 10000 microns if a width value is not passed to the macro.

Line (2) specifies the instructions required to derive a resistance value for the component "r3" positioned between nodes "i1" and "i2". Specifically, this value is defined as "rho$_{l3}$m3 *l3/w3". That is, the resistance of the specified component (r3) is defined as the product of the sheet resistivity (rho$_{l3}$m3) and the length (l3) divided by the width (w3). The sheet resistivity (rho$_{l3}$m3) is a known quantity based upon the metal type being used in the semiconductor circuit layout. As indicated above, each compaction component defined in accordance with the invention includes two spacial compaction values (l) and (w) that can be passed to the macro shown above. As long as a value is passed to the macro, the default values of line 1 are not used. When processing package resistance values of the package resistive network, it is not necessary to calculate the resistance as Specified in line (3).

Line (3) of the macro is used to define an electromigration ratio. The electromigration ratio is a ratio of the actual current over the current limit for a specified component. Thus, the value of the electromigration ratio should be below 1.0.

The first word in line (3) is a "measure" command. The next word "tran" indicates that the measurement should be taken during a transient run. The period of measurement during the transient run is specified at the end of the line as being from 0 nanoseconds to 12.5 nanoseconds. The next term in line (3) is "rms$_{l3}$3". This term is assigned to the output value, as will be shown below. The next term in line (3) is "rms" to specify that the rms (root mean square) value should be measured. The rms current value through the metal provides an indication of long term electromigration performance.

The next term in the line is the "par" or parameter command. This term indicates that the expression in the parentheses should be evaluated as an equation or value. In this case, the equation to be evaluated is the electromigration ratio. The numerator of the ratio is "i(r3)" which the SPICE compiler reads as the current in r3. As indicated above, the term r3 is the resistance of the compaction component with the associated spacial compaction values w3 and l3 that were passed to the macro. The denominator of the ratio is the value "em$_{l3}$m3" which is a maximum current/width value associated with metal 3. Again, this value is known based upon the type of metal used in the semiconductor circuit layout. The final value in the denominator is the total width "w3". The total width "w3" is a spacial collapse value passed to the macro. The product of the total width "w3" and the value "em$_{l3}$m3" provides a maximum current value for the specified piece of metal. Thus, line (3) defines an electromigration ratio. If the electromigration ratio is over one, then the circuit must be redesigned to correct the electromigration violation.

Line (4) of the macro is used to obtain a voltage reading at a particular node. The syntax of the line is consistent with that of line (3). However, line (3) measures an rms value, while line (4) measures the maximum voltage measured during a simulation. The present invention relies upon a maximum voltage value in order to obtain information regarding worse case voltage drops that can be associated with a circuit.

The operative command in line (4) is to measure the voltage at node "i1". If the voltages at each node are known, then excessive voltage drops in the circuit can be identified, as will be described below. A simulation is first run to find the electromigration values. Thus, the instruction at line (4) of the macro is commented out during the electromigration simulation. When the voltage drop simulation is executed, the instruction at line (3) of the macro is commented out.

The following macro is generally consistent with the previously described macro. However, this macro is called to handle the scenario wherein two metal trunks are stacked upon each other.

(7) .macro m23 i1 i2 w2=1 l2=10000 w3=1 l3=10000

(8) r2 i1 i2 'rho$_{l3}$m2*l2/w2'

(9) r3 i1 i2 'rho$_{l3}$m3,l3/w3'

(10) .measure tran rms$_{l3}$23$_{l3}$2 rms par('i(r2)/(em$_{l3}$m2*w2)') from=0n to=12.5 n (11) .measure tran rms$_{l3}$ 23$_{l3}$3 rms par('i(r3)/(em$_{l3}$m3*w3)') from=0n to=12.5 n (12) .measure tran max$_{l3}$v23 max par('v(i1)') from=0n to =12.5 n (13) .eom m23

Line (7) of the macro includes additional parameters for the length and width of metal 2 (w2, l2). Because two metal layers are processed, the code includes two lines to characterize two resistance values r2 and r3. The code also includes two lines (10) and (11) to obtain two electromigration ratio values, one for each metal layer. Finally, the code includes a single line (12) to define the voltage value at the specified node. Note that the voltage at the node is equivalent for both metal layers, but the current in each metal layer can be different.

An additional macro, shown below, may be used to "center tap" a compaction component value. The center tap operation equally divides the resistivity of the compaction component into two terms as shown below.

(16) macro m3i i1 i2 ix w3=1 l3=10000

(17) r3 i1 ix '0.5 * rho$_{l3}$m3 * l3/w3'

(18) r6 ix i2 '0.5 * rho$_{l3}$m3*l3/w3'

(19) .measure tran rms$_{l3}$3$_{l3}$ 3 rms par('i(r3)/(em$_{l3}$m3*w3') from=0n to=12.5 n (20) .measure tran rms$_{l3}$3$_{l3}$6 rms par('i(r6)/(em$_{l3}$m3*w3') from=0n to=12.5 n (21) .measure tran max$_{l3}$v3$_{l3}$1 max par('v(i1)') from=0n to=12.5 n (22) .measure tran max$_{l3}$v3$_{l3}$2 max par('v (i2)') from=0n to=12.5 n (23) .measure tran max$_{l3}$3x x$_{l3}$max par('v(ix)') from=0n to=12.5 n (24) .eom m3i Note in lines (17) and (18) that the component "m3i" is assigned two resistance values "r3" and "r6". Each resistance value is one-half (0.5) the value of the resistance of the compaction value. The remaining code assigns two electromigration values and two voltage values to the center tapped component.

The center tapped component is useful in simulating current waveforms for a given functional area. Specifically, the circuit simulation program 52 is used to inject a current waveform at the center tap. The current consumption operation associated with the functional area may then be assessed. Note in FIG. 6 that each functional area 82, 84, and 86 includes a single center tapped compaction component. Thus, to assess the current consumption operation of each functional area, current is injected at the tap point of each compaction component. In contrast, in FIG. 7 the functional area "pc" includes eight compaction components (pc1t, pc2t, pc3t, pc4t, pc1b, pc2b, pc3b, and pc4b). Thus, to test this region the injected current must be divided among the eight compaction components.

The following is a set of example output data that is generated by the previously described macros. The data is referred to herein as power network simulation data 54.

(30) 519:$rms_{13}$3xi.xiq48. 1.4062E+00

(31) 756:$rms_{13}23_{13}$2xi.xiq13. 5.0716E-01

(32) 756:$rms_{13}23_{13}$3xi.xiq13. 7.0683E-01

(33) 825:$rms_{13}3_{13}$6xi.xiq41. 6.7741E-01

(34) 825:$rms_{13}3_{13}$3xi.xiq41. 6.6667E-01

(35) 519:$max_{13}$v3xi.xiq48.1.3991E+00

(36) 77:$max_{13}$v23xiq17.1.1916E+00

(37) 852:$max_{13}v3_{939\ 13}$1xi.xiq45. 1.3991E+00

(38) 852:$max_{13}v3_{13}$2xi.xiq45. 1.3954E+00

(39) 852:$max_{13}v3_{13}$xxi.xiq45. 1.1888E+00 The first output term in line (30) is the number "519" which is the component number assigned to the element by the circuit simulation program 52. The next several letters "$rms_{13}$3" were assigned at line (3) of the macro described above. The next several letters "xi.xiq48" correspond to the compaction component "iq48" shown in FIG. 8. This element has an electromigration value of 1.4062. Since the electromigration ratio is over one, this element is problematic.

Lines (31) and (32) follow the format of line (30). The terms "$rms_{13}23_{13}$2" and "$rms_{13}23_{13}$3" were respectively assigned at lines (10) and (11) of the macro described above. The final values in lines (31) and (32) are the two electromigration ratios associated with the stacked power bus at compaction component "iq13" shown in FIG. 8. Lines (33) and (34) are similar in nature, but were generated based upon the previously described macro lines (19) and (20).

An electromigration identification device 56 may be used to scan the power network simulation data 54. The device 56 is a set of computer instructions to identify any ratio over 1.0. This electromigration violation is then reported to a user through an input/output device 24.

Lines (35)–(39) are sample output voltage values forming a portion of the power network simulation data 54. Line (35) generally corresponds to previously described line (30), but provides a peak voltage output value associated with the compaction component "iq48".

The output at line (36) corresponds to the statement at line (12) above. The output at lines (37)–(39) correspond to the statements at lines (21)–(23) above.

An excessive voltage drop flagging device 58 may be used to identify large voltage drops between adjacent nodes. Such a device can be implemented as a set of code to analyze the voltage values of the power network simulation data 54. The code can be written to recognize voltage drops that exceed a predetermined permitted voltage drop value. (The voltage drop is the difference between ground and the measured maximum voltage value). Upon encountering a voltage drop that exceeds the predetermined permitted voltage drop value, a signal is sent through the input/output device 24 to warn the user of a problematic voltage drop.

Attention returns now to FIG. 2. If electromigration violations or excess voltage drops are identified, then the semiconductor circuit layout is refined (block 130) to eliminate the specified problems. This operation may be performed manually, or through the use of a place and route refinement rulebase 59. The rulebase 59 includes a set of design modification options to be exercised in the event of an electromigration violation or excessive voltage drop. For example, in the event of an electromigration violation, the width of the power trunk is incrementally increased by a specified amount.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method of analyzing the power network performance of a semiconductor circuit layout, said method comprising the steps of:

extracting from a semiconductor circuit layout the power network associated with said semiconductor circuit layout;

deriving a compacted resistive network corresponding to said power network, said deriving step including the steps of deriving a primary resistive network including a set of primary compaction components characterizing power trunks within said semiconductor circuit layout, each of said primary compaction components including an associated power trunk length value and power trunk width value for use in calculating a primary compaction component resistance value, and deriving a secondary resistive network including a set of secondary compaction components characterizing the electrical resistance of power straps that deliver power to transistors within said semiconductor circuit layout, each of said secondary compaction components including an associated power strap length value characterizing the physical length of the power straps in a functional region of said semiconductor circuit layout and a width value characterizing the physical width of the sum of all power straps in said functional region;

running a circuit simulation of said compacted resistive network to identify any power network performance that does not comply with predetermined criteria; and refining the topology of said semiconductor circuit layout to improve power network performance that does not comply with said predetermined criteria.

2. The method of claim 1 further comprising the steps of:

establishing a package resistive network to characterize the resistance of a package housing a semiconductor circuit corresponding to said semiconductor circuit layout; and combining said package resistive network into said compacted resistive network prior to said running step.

3. The method of claim 1 wherein said running step includes the step of identifying electromigration values that exceed a predetermined threshold value.

4. The method of claim 1 wherein said running step includes the step of identifying voltage drop values that exceed a predetermined threshold value.

5. A computer readable memory storing executable instructions for execution by a computer, comprising:

a plurality of instruction sets stored in said computer readable memory, including a first instruction set to extract from a semiconductor circuit layout the power network associated with said semiconductor circuit layout;

a second instruction set to derive a compacted resistive network corresponding to said power network, said second instruction set including first sub-set instruction to derive a primary resistive network including a set of primary compaction components characterizing power trunks within said semiconductor circuit layout, each of said primary compaction components including an associated power trunk length value and power trunk width value for use in calculating a primary compaction component resistance value, and second sub-set instructions to derive a secondary resistive network including a set of secondary compaction components characterizing the electrical resistance of power straps that deliver power to transistors within said semiconductor circuit layout, each of said secondary compaction components including an associated power strap length value characterizing the physical length of the power straps in a functional region of said semiconductor circuit layout and a width value characterizing the physical width of the sum of all power straps in said functional region;

a third instruction set to run a circuit simulation of said compacted resistive network to identify any power network performance that does not comply with predetermined criteria; and a fourth instruction set to refine the topology of said semiconductor circuit layout to improve power network performance that does not comply with said predetermined criteria.

6. The computer readable memory of claim 5 further including third sub-set instructions of said second instruction set to establish a package resistive network to characterize the resistance of a package housing a semiconductor circuit corresponding to said semiconductor circuit layout; and fourth sub-set instructions of said second instruction set to combine said package resistive network into said compacted resistive network.

7. The computer readable memory of claim 6 wherein said third instruction set includes instructions to identify electromigration values exceeding a predetermined threshold value.

8. The computer readable memory of claim 6 wherein said third instruction set includes instructions to identify voltage drops exceeding a predetermined threshold.

* * * * *